(12) United States Patent
Igarashi et al.

(10) Patent No.: US 6,936,927 B2
(45) Date of Patent: *Aug. 30, 2005

(54) CIRCUIT DEVICE HAVING A MULTI-LAYER CONDUCTIVE PATH

(75) Inventors: Yusuke Igarashi, Gunma (JP); Noriaki Sakamoto, Gunma (JP); Yoshiyuki Kobayashi, Gunma (JP); Takeshi Nakamura, Gunma (JP)

(73) Assignee: Sanyo Electric Co., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/171,824

(22) Filed: Jun. 14, 2002

(65) Prior Publication Data

US 2002/0190377 A1 Dec. 19, 2002

(30) Foreign Application Priority Data

Jun. 19, 2001 (JP) ................................... P. 2001-185420

(51) Int. Cl.$^7$ ........................ H01L 23/48; H01L 23/52; H01L 23/12; H01L 23/053; H01L 29/40
(52) U.S. Cl. ........................ 257/775; 257/700; 257/782; 257/738
(58) Field of Search ................................ 257/778, 738, 257/736, 781, 782, 774, 775, 758, 700; 438/107, 126, 127

(56) References Cited

U.S. PATENT DOCUMENTS

| | | | | |
|---|---|---|---|---|
| 5,473,512 A | * | 12/1995 | Degani et al. | 361/760 |
| 6,365,979 B1 | * | 4/2002 | Miyajima | 257/787 |
| 6,384,344 B1 | * | 5/2002 | Asai et al. | 174/261 |
| 6,400,010 B1 | * | 6/2002 | Murata | 257/706 |
| 6,410,979 B2 | * | 6/2002 | Abe | 257/684 |
| 6,487,088 B2 | * | 11/2002 | Asai et al. | 361/794 |
| 6,518,090 B2 | * | 2/2003 | Dotta et al. | 438/106 |
| 6,573,595 B1 | * | 6/2003 | Chen et al. | 257/698 |
| 6,617,695 B1 | * | 9/2003 | Kasatani | 257/778 |
| 6,664,138 B2 | * | 12/2003 | Igarashi et al. | 438/126 |
| 6,707,152 B1 | * | 3/2004 | Schrock | 257/738 |
| 6,731,013 B2 | * | 5/2004 | Juso et al. | 257/779 |
| 2001/0038145 A1 | * | 11/2001 | Mashino | 257/707 |
| 2003/0082846 A1 | * | 5/2003 | Yoneda et al. | 438/106 |

* cited by examiner

*Primary Examiner*—Nathan J. Flynn
*Assistant Examiner*—Victor A. Mandala, Jr.
(74) *Attorney, Agent, or Firm*—Fish & Richardson P.C.

(57) ABSTRACT

A circuit device and a method for fabrication the same is provided. An insulation resin sheet in which the first conductive layer 3 and the second conductive layer 4 are adhered to each other by insulation resin 2 is used. The first conductive path layer 5 is formed by the first conductive layer 3, the second conductive path layer 6 is formed by the second conductive layer 4, and both of the conductive path layers are connected by multi-layer connecting means 12. Since a semiconductor element 7 is adhered to and fixed on overcoating resin 8 that covers the first conductive path layer 5, a multi-layer connection structure can be achieved by the first conductive path layer 5 and the second conductive path layer 6. Further, the second conductive layer 4 that is made thick can prevent warping from occurring due to a difference in a thermal expansion coefficient.

8 Claims, 9 Drawing Sheets

PRIOR ART

FIG.12

PRIOR ART

CIRCUIT DEVICE HAVING A MULTI-LAYER CONDUCTIVE PATH

BACKGROUND OF THE INVENTION

1. Field of the Invention

The present invention relates to a circuit device and a method for fabricating the same, and in particular to a thin circuit device which is able to achieve multi-layer path, using two sheets of conductive layers, and a method for fabricating the same.

2. Description of the Prior Arts

Recently, IC packages have been actively employed in portable devices, and small-sized and high density assembly devices. Conventional IC packages and assembly concepts tends to greatly change. For example, this is described in, for example, Japanese Laid-Open Patent Publication No. 2000-133678. This pertains to a technology regarding a semiconductor apparatus in which a polyimide resin sheet being a flexible sheet is employed as one example of insulation resin sheets.

FIG. 12 through FIGS. 14A, 14B and 14C show a case where a flexible sheet 50 is employed as an interposer substrate. Also, the views illustrated upside of the respective drawings are plan views, and the views illustrated downside thereof are longitudinally sectional views taken along the lines A—A of the respective drawings.

Figure 12:
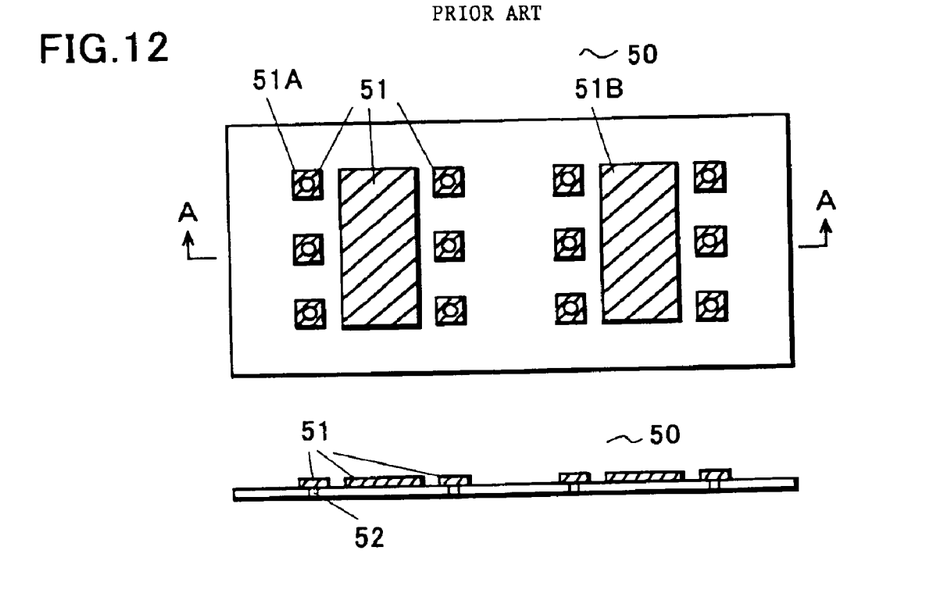
FIG. 12 is a view describing a method for fabricating a semiconductor according to prior arts.

First, copper foil patterns 51 are prepared to be adhered to each other via an adhesive resin on the flexible sheet 50 illustrated in FIG. 12. These copper foil patterns 51 have different patterns, depending upon cases where a semiconductor element to be assembled is a transistor or an IC. Generally speaking, a bonding pad 51A and an island 51B are formed. Also, an opening 52 is provided to take out an electrode from the rear side of the flexible sheet 50, from which the above-described copper foil pattern 51 is exposed.

Figure 13:
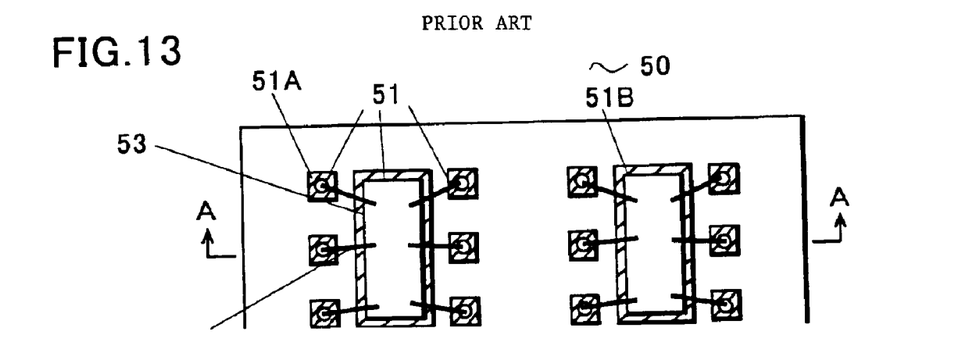
FIG. 13 is a view describing a method for fabricating a semiconductor according to prior arts.

Subsequently, the flexible sheet 50 is transferred onto a die bonder, and as shown in FIG. 13, a semiconductor element 53 is assembled or mounted. After that, the flexible sheet 50 is transferred onto a wire bonder, wherein the bonding pads 51A are electrically connected to the pads of the semiconductor elements 53 by thin metal wires 54.

Figure 14A:
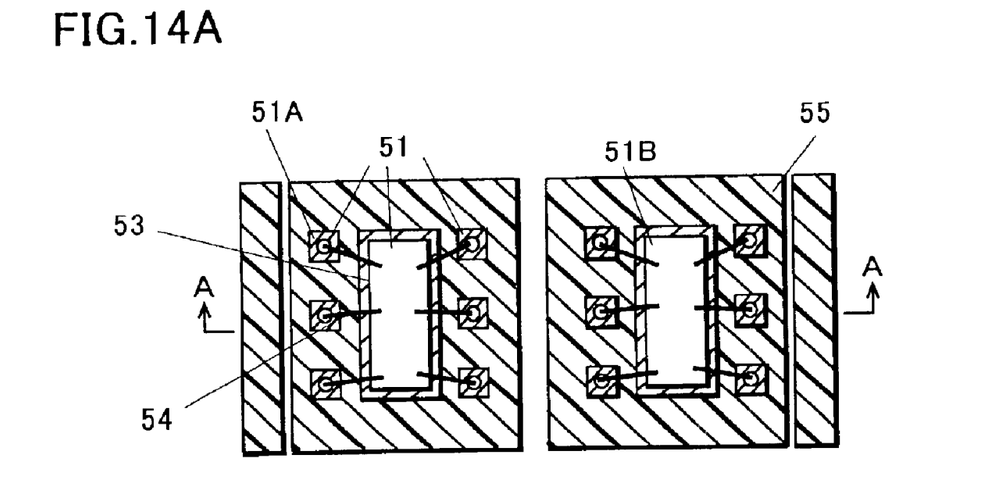
FIGS. 14A, 14B and 14C are views describing a method for fabricating a semiconductor according to prior arts.

Finally, as shown in FIG. 14A, sealing resin 55 is provided on the surface of the flexible sheet 50, and the surface thereof is completely sealed with the sealing resin 55. Herein, the bonding pads 51A, island 51B, semiconductor elements 53 and thin metal wires 54 are transfer-molded so as to be completely overcoated.

Figure 14B:
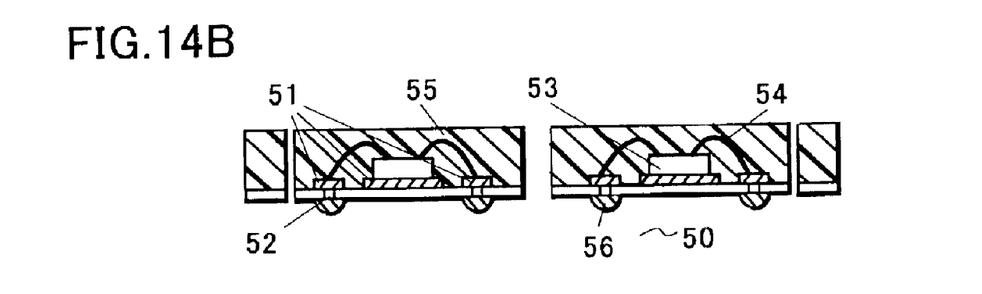
Figure 14C:
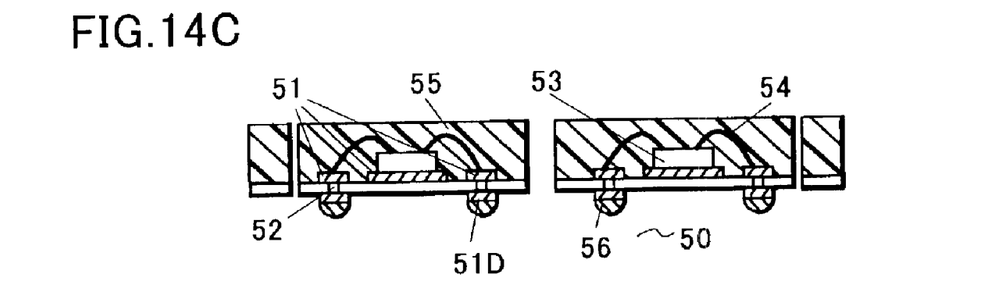

After that, as shown in FIG. 14B, connecting means 56 such as solder and a soldering ball is provided, wherein spherical solder 56 deposited to the bonding pad 51A is formed via the opening 52 by passing through a solder reflow furnace. Further, since semiconductor elements 53 are formed in the form of a matrix on the flexible sheet 50, these are diced to be separated from each other as shown in FIGS. 14.

In addition, the sectional view of FIG. 14C shows electrodes 51A and 51D on both sides of the flexible sheet 50 as the electrodes. The flexible sheet 50 is generally supplied from a maker after both sides thereof are patterned.

Since a semiconductor apparatus that employs the above-described flexible sheet 50 does not utilize any publicly known metal frame, the semiconductor apparatus has a problem in that a multi-layer connection structure cannot be achieved while it has an advantage by which a remarkably thin package structure can be brought about, wherein path is carried out with one layer of copper foil pattern 51, which is provided substantially on the surface of the flexible sheet 50.

It is necessary to make the flexible sheet 50 sufficiently thick, for example, approx. 200 $\mu$m, in order to retain supporting strength to achieve a multi-layer connection structure. Therefore, there is a problem of retrogression with respect to thinning of the sheet.

Further, in the method for fabricating a circuit device, a flexible sheet 50 is transferred in the above-described fabrication apparatus, for example, a die bonder, wire bonder, a transfer mold apparatus, and a reflow furnace, etc., and the flexible sheet 50 is attached onto a portion called a "stage" or a "table".

Figure 15:
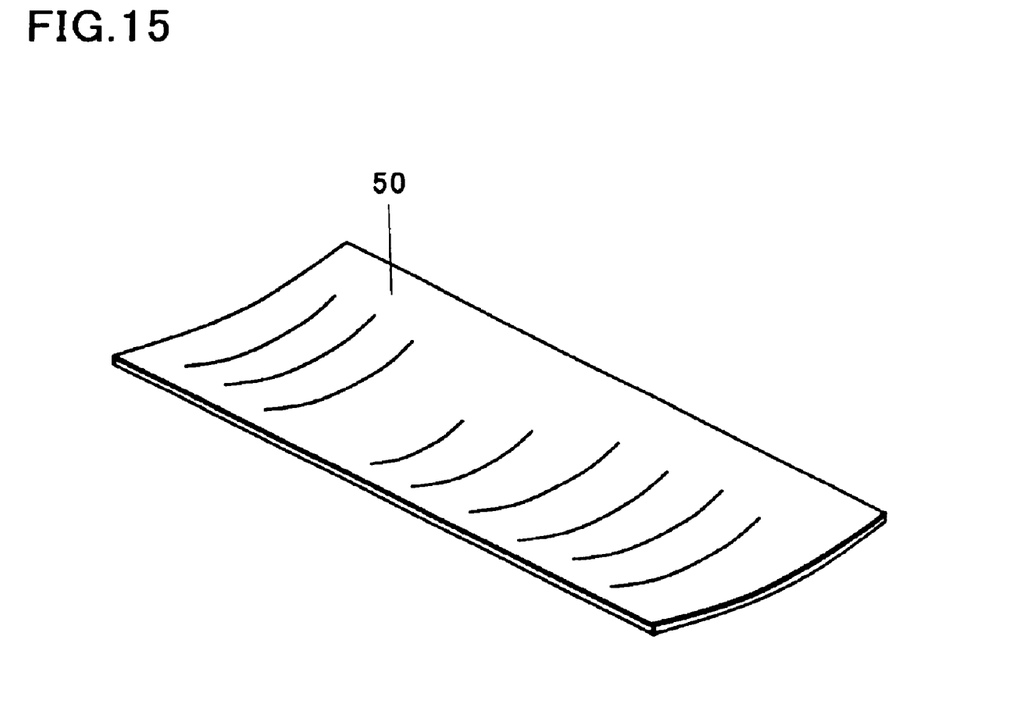
FIG. 15 is a view describing a prior art flexible sheet.

However, if the thickness of the insulation resin that becomes the base of the flexible sheet 50 is made thin, for example, 50 $\mu$m, the flexible sheet 50 may be warped as shown in FIG. 15 or its transfer performance may be remarkably worsened where the thickness of the copper foil pattern 51 formed on the surface thereof is thin to be 9 through 35 $\mu$m. In addition, another problem arises in that the flexible sheet 50 is defectively attached to the above-described stage or table. This is because it is considered that the resin is warped since the insulation resin itself is very thin, and the resin is warped due to a difference in the thermal expansion coefficient between the copper foil pattern 51 and the insulation resin. Particularly, still another problem exists in that, if a hard insulation material not having any core material of glass cloth fibers is warped as shown in FIG. 15, the hard insulation material may be easily collapsed due to compression from above.

Since the portion of the opening 52 is compressed from above when being molded, a force by which the periphery of the bonding pad 51A is warped upward is brought about, the adhesion of the bonding pad 51A is worsened.

Also, the resin material that constitutes a flexible sheet 50 has less flexibility, or if a filler to increase the thermal conductivity is blended, the flexible sheet 50 is made hard. In such a case, where bonding is carried out by a wire bonder, there may be a case where the bonded portion is cracked. Also, when performing transfer molding, there is a case where the portion with which a metal die is brought into contact is cracked. This remarkably occurs if any warping shown in FIG. 15 is provided.

Although the flexible sheet 50 described above is such a type that no electrode is formed on the rear side thereof, there are cases where an electrode 51D is formed on the rear side of the flexible sheet 50 as shown in FIG. 14C. At this time, since the electrode 51D is brought into contact with the above-described fabrication apparatus or is brought into contact with the transfer plane of transfer means between the fabrication apparatuses, another problem occurs in that damage and scratches arise on the rear side of the electrode 51D, wherein the electrode is established with such damage and scratches retained, the electrode 51 itself may be cracked due to application of heat later on.

Also, if an electrode 51D is provided on the rear side of the flexible sheet 50, a problem occurs in that, when carrying out transfer molding, no facial contact with the stage can be secured. In this case, if the flexible sheet 50 is composed of a hard material as described above, the electrode 51D becomes a fulcrum and the periphery of the electrode 51D is compressed downward, wherein the flexible sheet 50 is cracked.

SUMMARY OF THE INVENTION

The present invention was developed in view of the above-described problems and shortcomings. First, in view of the structure, these problems and shortcomings can be solved by a circuit device including: a first conductive layer; a second conductive layer; insulation resin by which the above-described first conductive layer and the above-described second conductive layer are adhered to each other in the form of a sheet; a first conductive path layer that is formed by etching the above-described first conductive layer; a second conductive path layer that is formed by etching the above-described second conductive layer; a semiconductor element electrically insulated and fixed on the above-described first conductive path layer; multi-layer connecting means for connecting the above-described first conductive path layer and the above-described second conductive path layer to each other at appointed points, passing through the above-described insulation resin; a sealing resin layer for overcoating the above-described first conductive path layer and the above-described semiconductor element; and an external electrode secured at an appointed point of the above-described second conductive path layer.

The first conductive layer and the second conductive layer are electrically insulated from each other by remarkably thin insulation resin, and are made into a physically integrated sheet. The first conductive path layer is formed by the first conductive layer, and the second conductive path layer is formed by the second conductive layer, wherein the first conductive path layer and the second conductive path layer are connected to each other by multi-layer connecting means to bring about a multi-layered path structure.

Also, the semiconductor element is electrically insulated from the first conductive path layer by overcoating resin and is adhered and fixed thereat, wherein the first conductive path layer can be freely lead on the lower part of the semiconductor element.

Secondly, in view of the method for fabricating a circuit device, the above-described problems and shortcomings can be solved by a method for fabricating a circuit device, which comprises the steps of: preparing a circuit substrate sheet in which the first conductive layer and the second conductive layer are adhered to each other by insulation resin; forming through holes in the above-described first conductive layer and the above-described insulation resin at an appointed point of the above-described circuit substrate, and selectively exposing the above-described second conductive layer; forming multi-layer connecting means in the above-described through holes and electrically connecting the above-described first conductive layer and the above-described second conductive layer to each other; forming a first conductive path layer by etching the above-described first conductive layer to an appointed pattern; electrically insulating a semiconductor element and adhering and fixing the above-described semiconductor element on the above-described first conductive path layer; overcoating the above-described first conductive path layer and the above-described semiconductor element with a sealing resin layer; forming a second conductive path layer by etching the above-described second conductive layer to an appointed pattern; and forming an external electrode at an appointed point of the above-described second conductive path layer.

Since the flexible sheet is formed to be thick by the first conductive layer and the second conductive layer, the flatness of a sheet-shaped circuit substrate can be maintained even if the insulation resin is thin.

Before the step of overcoating the first conductive path layer and semiconductor elements by a sealing resin layer, the mechanical strength of the first conductive path layer and semiconductor elements can be retained by the second conductive layer. After that, the mechanical strength is brought about by the sealing resin layer. Therefore, it is possible to easily form the second conductive path layer by the second conductive layer. As a result, the insulation resin does not need any mechanical strength, wherein it is possible to make the insulation resin thin to the thickness by which electrical insulation can be maintained.

Further, since the lower die mold and planes of a transfer molding apparatus are brought into contact with the entirety of the second conductive layer, no local compression is brought about, and it is possible to prevent the insulation resin from being cracked.

Still further, since the first conductive layer can form the first conductive path layer after a multi-layer connecting means is formed in through holes, the multi-layer connecting means can be formed without any mask.

A circuit device according to the invention has the following advantages in view of structure.

First, since the first conductive layer is formed to be thin, the first conductive path layer can be finely patterned, wherein a semiconductor element whose number of electrode pads is 100 or more can be built in.

Second, since the semiconductor element is electrically insulated from the first conductive path layer by overcoating resin, path can be routed below the semiconductor element, wherein a freedom of routing the first conductive path layer can be remarkably increased, and a multi-layered connecting structure can be brought about.

Third, in comparison with cases where conventional glass epoxy resin substrates and interposer substrates such as flexible sheets are used, the mechanical strength can be retained by the second conductive layer and the sealing resin layer by employment of an insulation resin sheet, wherein a remarkably thin structure can be achieved.

Fourth, since low-temperature resin or super low-temperature resin is employed as the insulation resin, not only can be the insulation resin made thin but also the thermal resistance thereof can be remarkably decreased, wherein heat of the semiconductor elements can be immediately irradiated.

In addition, a method for fabricating the circuit device according to the invention has the following advantages.

First, warping of the insulation resin sheet can be solved by the second conductive layer, and transfer performance thereof can be improved.

Second, since through holes, which are formed in an insulation resin, are prepared by a carbonic acid gas laser, plating for multi-layer connecting means can be carried out immediately thereafter, the process can be made remarkably simple. Also, if copper plating is used as the multi-layer connecting means, the first conductive layer and the second conductive layer can be made of the same material (copper), the processes after that can be made simple.

Third, since the multi-layer connecting means is achieved by a plated layer, the multi-layer connecting means can be formed without any mask before the first conductive path layer is formed. Since patterning can be performed simultaneously with the formation of the first conductive path layer, it becomes remarkably simple to form the multi-layer connecting means.

Fourth, since the mechanical support of the insulation resin sheet is retained by the second conductive layer until the sealing resin layer is formed, and the mechanical support of the insulation resin sheet is retained by the sealing resin layer after the second conductive path layer is formed, the mechanical strength of the insulation resin is disregarded, wherein a remarkably thin assembly method can be achieved.

Fifth, since both sides of the insulation resin are covered by the first and second conductive layer even where the insulation resin itself is hard or becomes hard by a filler being blended therein, flatness of the insulation resin sheet itself can be increased in the fabrication process, and it is possible to prevent cracks from occurring.

Sixth, since the insulation resin sheet has a second conductive layer thickly formed on its rear side, the insulation resin sheet can be utilized as a support substrate for die bonding of chips and for sealing a wire bonder and semiconductor elements. In addition, where the insulation resin material itself is soft, propagation of energy for wire bonding can be improved, and the wire bondability can be further improved.

DESCRIPTION OF THE PREFERRED EMBODIMENTS

First Embodiment Describing a Circuit Device

Figure 1:
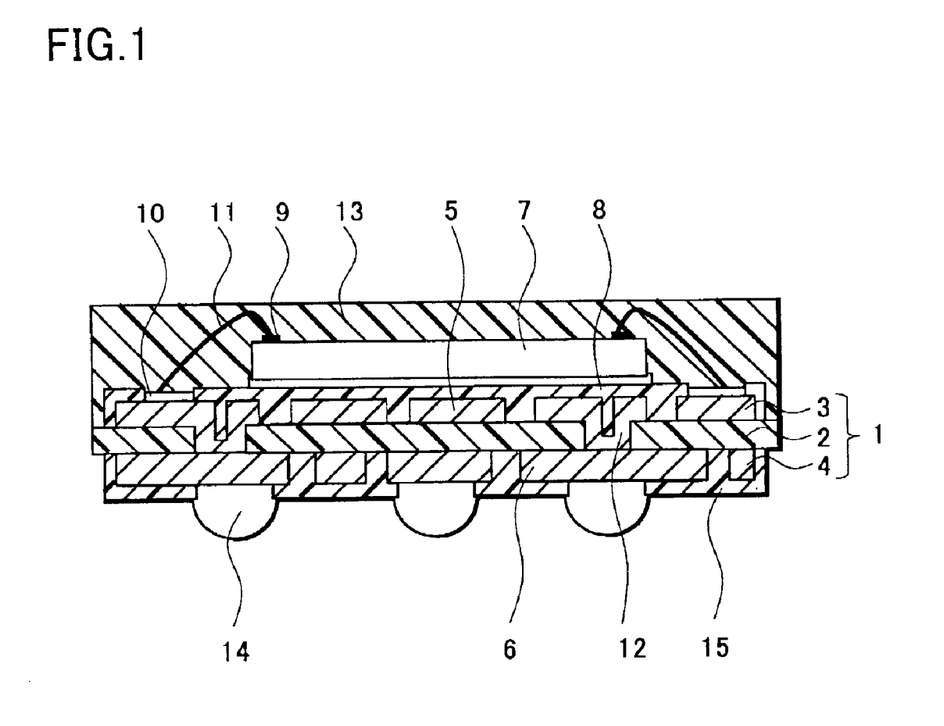
FIG. 1 is a sectional view describing a circuit device according to the invention.

A circuit device according to the invention is comprised, as shown in FIG. 1, of a first conductive layer 3; a second conductive layer 4; insulation resin 2 by which the above-described first conductive layer 3 and the above-described second conductive layer 4 are adhered to each other in the form of a sheet; a first conductive path layer 5 that is formed by etching the above-described first conductive layer 3; a second conductive path layer 6 that is formed by etching the above-described second conductive layer 4; a semiconductor element 7 electrically insulated and fixed on the above-described first conductive path layer 5; multi-layer connecting means 12 for connecting the above-described first conductive path layer 5 and the above-described second conductive path layer 6 to each other at appointed points, passing through the above-described insulation resin 2; a sealing resin layer 13 for overcoating the above-described first conductive path layer 5 and the above-described semiconductor element 7; and an external electrode 14 secured at an appointed point of the above-described second conductive path layer 6.

Figure 3:
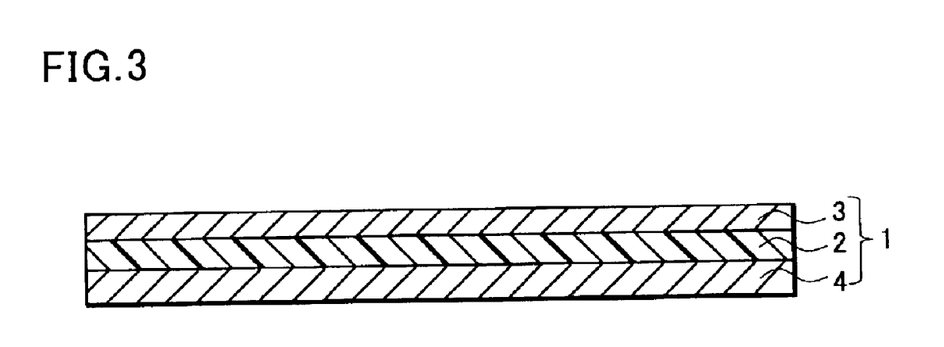
FIG. 3 is a sectional view describing a method for fabricating a circuit device according to the invention.

First, a description is given of an insulation resin sheet. In FIG. 3, the entirety is an insulation resin sheet 1. The intermediate layer is insulation resin 2. The first conductive layer 3 is formed on the surface of the insulation resin 2, and the second conductive layer 4 is formed on the rear side thereof.

That is, the first conductive layer 3 is formed on substantially the entire surface of the insulation resin sheet 1, and the second conductive layer 4 is formed on substantially the entire rear side thereof. The material of the insulation resin 2 is an insulation material composed of macromolecules such as polyimide resin or epoxy resin, etc. In addition, the first conductive layer 3 and the second conductive layer 4 are, preferably, mainly composed of copper (Cu), or a publicly known material of a lead frame, and the layer 3 and 4 are coated on the insulation resin 2 by a plating method, a deposition method, or a spattering method, or a metallic foil formed by a rolling method or a plating method may be adhered thereto.

Also, the insulation resin sheet 1 may be formed by a casting method. Hereinafter, a brief description is given of the casting method. First, glue type polyimide resin is coated on the first conductive layer of a flat film, and glue type polyimide resin is coated on the second conductive layer of a flat film. Then, by adhering the two sheets of polyimide resin together after the polyimide is semi-hardened, an insulation resin sheet 1 can be fabricated. Therefore, the insulation resin sheet 1 does not require any glass cloth fibers for reinforcement.

A characteristic point of the invention resides in that the second conductive layer 4 is made thicker than the first conductive layer 3.

The first conductive layer 3 is formed to become 5 through 35 $\mu$m thick, so that a fine pattern can be fabricated by making the layer 3 as thin as possible. The second conductive layer 4 may be formed to become 70 through 200 $\mu$m thick, wherein emphasis is placed on the supporting strength.

Therefore, the flatness of the insulation resin sheet 1 can be maintained by forming the second conductive layer 4 thicker than the layer 3, wherein workability of subsequent processes can be improved, and it becomes possible to prevent the insulation resin 2 from being cracked or to prevent cracks from being brought about.

Since the overcoating resin can be hardened while maintaining the flatness, the rear side of a package can be made flat, and electrodes formed on the rear side of the insulation resin sheet 1 can be disposed to be flat, whereby the electrodes on an assembly substrate can be brought into contact with those on the rear side of the insulation resin sheet 1, and it is possible to prevent solder from becoming defective.

Polyimide resin, epoxy resin, etc., are preferably used as the insulation resin 2. In the case of a casting method in which paste-like resin is coated to fabricate a sheet, the layer thickness is 10 through 100 $\mu$m. Also, in a case of forming the insulation resin 2 as a sheet, a sheet that is available on the market has a minimum thickness of 25 $\mu$m. Also, a filler may be blended therein in consideration of thermal conductivity. Glass, Si oxide, aluminum oxide, Al nitride, Si carbide, boron nitride, etc., are considered as materials of the filler.

As described above, the insulation resin 2 maybe selected from resin having low thermal resistance, or that having super low thermal resistance, in which the above-described filler is blended, or polyimide resin. These resins may be selectively used, depending upon the characteristics of a circuit device to be formed.

The first conductive path layer 5 is formed by etching the first conductive layer 3. The first conductive layer 3 is formed to become 5 through 35 µm thick, and bonding pads 10 and the first conductive path layer 5 extending from these bonding pads 10 to the center of a substrate are formed by etching at the periphery thereof. A finer pattern is requisite in line with an increase in the number of pads of semiconductor elements to be incorporated.

The second conductive path layer 6 is formed by etching the second conductive layer. The second conductive layer 4 is 70 through 200 µm thick, and is not suitable for making a pattern fine. However, the second conductive layer is used to mainly form an external electrode 14, and multi-layer path can be formed as necessary.

The semiconductor element 7 is adhered to and fixed on the overcoating resin 8, which overcoats the first conductive path layer 5, by an adhesive resin. The semiconductor element 7 and the first conductive path layer 5 are electrically insulated from each other. As a result, the first conductive path layer 5 of a fine pattern can be freely routed below the semiconductor element 7, wherein the freedom of path can be remarkably increased. Respective electrode pads 9 of the semiconductor element 7 are connected to the bonding pads 10, which are parts of the first conductive path layer 5 secured at the periphery, by bonding wires 11. In addition, the bonding pads 10 have their surfaces plated with gold or silver in order to ensure bonding.

The multi-layer connecting means 12 connects the first conductive path layer 5 and the second conductive path layer 6 together at appointed points through the insulation resin 2. In detail, a copper-plated layer is suitable as the multi-layer connecting means 12. Also, a plated layer of gold, silver, palladium, etc., may be acceptable.

The sealing resin layer 13 overcoats the first conductive path layer 5 and the semiconductor element 7. The sealing resin layer 13 is concurrently used to function as a mechanical support of a completed circuit device.

The external electrode 14 is provided at an appointed point of the second conductive path layer 6. That is, almost all the parts of the second conductive path layer 6 are overcoated with overcoating resin 15, and an external electrode 14 formed of solder is provided on the exposed parts of the second conductive path layer 6.

Figure 2:
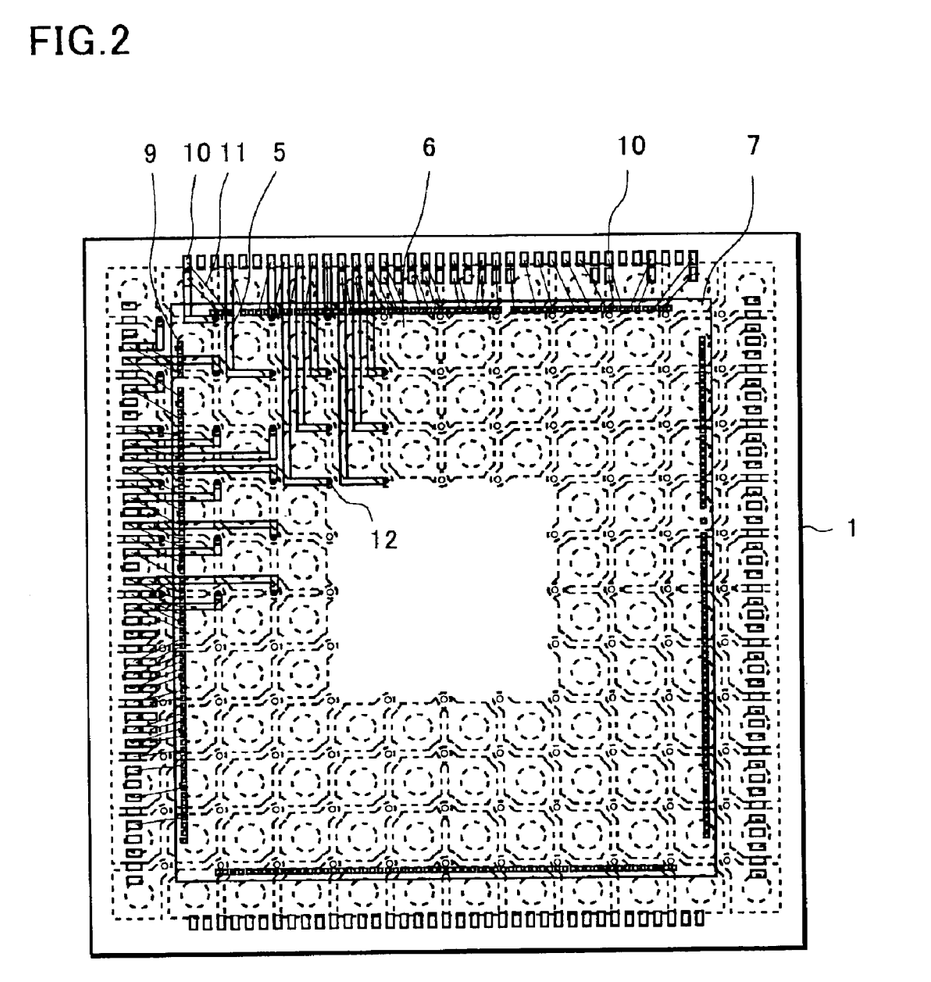
FIG. 2 is a plan view describing a circuit device according to the invention.

With reference to FIG. 2, a description is given of a detailed circuit device according to the invention. First, patterns shown with solid lines indicate the first conductive path layers 5, and patterns shown with dashed lines indicate the second conductive path layers 6. The first conductive path layers 5 are provided with bonding pads 10 at their peripheries so that the bonding pads surround the semiconductor elements 7 and correspond to semiconductor elements 7 having multiple pads, which are disposed in two stages. The bonding pad 10 is connected to an electrode pad 9, to which the semiconductor element 7 corresponds, by a bonding wire 11, and a number of the first conductive path layers 5 of a fine pattern extend below the semiconductor element 7 from the bonding pad 10, and are connected to the second conductive path layer 6 by the multi-layer connecting means 12 shown with black circles.

In such a structure, a semiconductor element having 200 or more pads is caused to extend, in the form of a multi-layer path structure, to an appointed second conductive path layer 6, utilizing a fine pattern of the first conductive path layer 5, and connection from the external electrode 14, which is provided on the second conductive path layer 6, to peripheral circuits can be carried out.

Second Embodiment Describing a Method for Fabricating a Circuit Device

A description is given of a method for fabricating a circuit device according to the invention with reference to FIG. 1 through FIG. 10.

A method for fabricating a circuit device according to the invention comprises the steps of: preparing an insulation resin sheet 1 in which the first conductive layer 3 and the second conductive layer 4 are adhered to each other by insulation resin 2; forming through holes 21 in the above-described first conductive layer 3 and the above-described insulation resin 2 at an appointed point of the above-described insulation resin sheet 1, and selectively exposing the rear side of the above-described second conductive layer 4; forming multi-layer connecting means 12 in the above-described through holes 21 and electrically connecting the above-described first conductive layer 3 and the above-described second conductive layer 4 to each other; forming a first conductive path layer 5 by etching the above-described first conductive layer 3 to an appointed pattern; electrically insulating a semiconductor element 7 and adhering and fixing the above-described semiconductor element 7 on the above-described first conductive path layer 5; overcoating the above-described first conductive path layer 5 and the above-described semiconductor element 7 with a sealing resin layer 13; forming a second conductive path layer 6 by etching the above-described second conductive layer 4 to an appointed pattern; and forming an external electrode 14 at an appointed point of the above-described second conductive path layer 6.

The first step of the invention prepares an insulation resin sheet 1 in which the first conductive layer 3 and the second conductive layer 4 are adhered to each other by the insulation resin 2 as shown in FIG. 3.

The first conductive layer 3 is formed on substantially the entire surface of the insulation resin sheet 1, and the second conductive layer 4 is formed on substantially the entire rear side thereof. In addition, the material of the insulation resin 2 is an insulation material composed of macromolecules such as polyimide resin or epoxy resin, etc. In addition, the first conductive layer 3 and the second conductive layer 4 are, preferably, mainly composed of copper (Cu), or a publicly known material of a lead frame, and the layer 3 and 4 are coated on the insulation resin 2 by a plating method, a deposition method, or a spattering method, or a metallic foil formed by a rolling method or a plating method may be adhered thereto.

Also, the insulation resin sheet 1 may be formed by a casting method. Hereinafter, a brief description is given of the casting method. First, glue type polyimide resin is coated on the first conductive layer 3 of a flat film, and glue type polyimide resin is coated on the second conductive layer 4 of a flat film. Then, by adhering the two sheets of polyimide resin together after the polyimide is semi-hardened, an insulation resin sheet 1 can be fabricated.

A characteristic point of the invention resides in that the second conductive layer 4 is formed to be thicker than the first conductive layer 3.

The first conductive layer 3 is formed to be 5 through 35 µm thick, and is made as thin as possible so that a fine pattern can be formed. The second conductive layer 4 may be formed to become 70 through 200 μm thick, wherein emphasis is placed on the supporting strength.

Polyimide resin, epoxy resin, etc., are preferably used as the insulation resin 2. In the case of a casting method in which paste-like resin is coated to fabricate a sheet, the layer thickness is 10 through 100 μm. Also, in a case of forming the insulation resin 2 as a sheet, a sheet that is available on the market has a minimum thickness of 25 μm. Also, a filler may be blended therein in consideration of thermal conductivity. Glass, Si oxide, aluminum oxide, Al nitride, Si carbide, boron nitride, etc., are considered as materials of the filler.

As described above, the insulation resin 2 maybe selected from resin having low thermal resistance, or that having super low thermal resistance, in which the above-described filler is blended, or polyimide resin. These resins may be selectively used, depending upon the characteristics of a circuit device to be formed.

Figure 4:
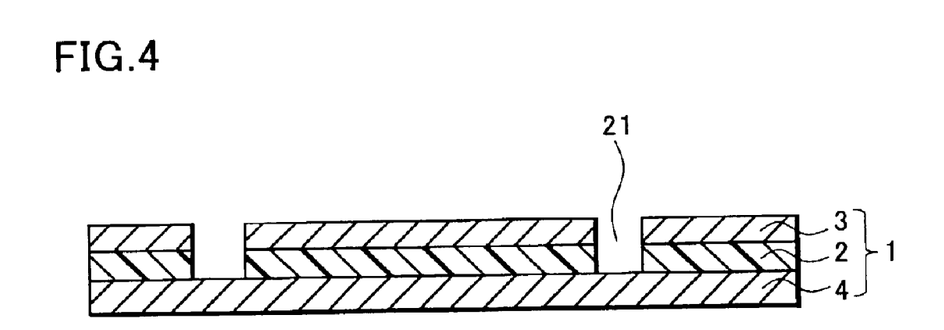
FIG. 4 is a sectional view describing a method for fabricating a circuit device according to the invention.

The second step according to the invention forms through holes 21 in the first conductive layer 3 and the insulation resin 2 at appointed points of the insulation resin sheet 1 as shown in FIG. 4, and selectively exposes the second conductive layer 4.

The entire surface is overcoated with photo-resist with only the portion exposed where the through holes 21 of the first conductive layer 3 are formed. And, the first conductive layer 3 is etched via the photo resist. Since the first conductive layer 3 is composed of Cu as the main material, chemical etching is carried out by using ferric chloride or cupric chloride as the etching solution. Although the opening diameter of the through holes 21 may change depending upon degree of photography resolution, herein, the diameter is 50 through 100 μm or so. Further, when carrying out etching, the second conductive layer 4 is protected from an etching solution by covering the same with an adhesive sheet. However, where the second conductive layer 4 is sufficiently thick and has a thickness by which the flatness can be maintained after etching, the second conductive layer 4 may be slightly etched. In addition, Al, Fe, Fe—Ni or a publicly known lead frame material may be acceptable as the first conductive layer 3.

Subsequently, using the first conductive layer 3 as a mask after removing the photo resist, the insulation resin 2 that is immediately below the through holes 21 is removed by a laser, and the rear side of the second conductive layer 4 is exposed on the bottom of the through holes 21. A carbonic acid gas laser is preferably used as the laser. In addition, where any residue remains on the bottom of the opening portion after the insulation resin is evaporated by the laser, wet etching is carried out, by using permanganic acid soda or persulphuric acid ammonium, in order to remove the residue.

With the step, where the first conductive layer 3 is thin at 10 μm or so, the first conductive layer 3 and the insulation resin 2 are collectively removed by the carbonic acid gas laser after portions other than the through holes 21 are overcoated with photo resist, thereby forming the through holes 21. In this case, a blackening treatment process is required in order to roughen the surface of the first conductive layer 3 in advance.

Figure 5:
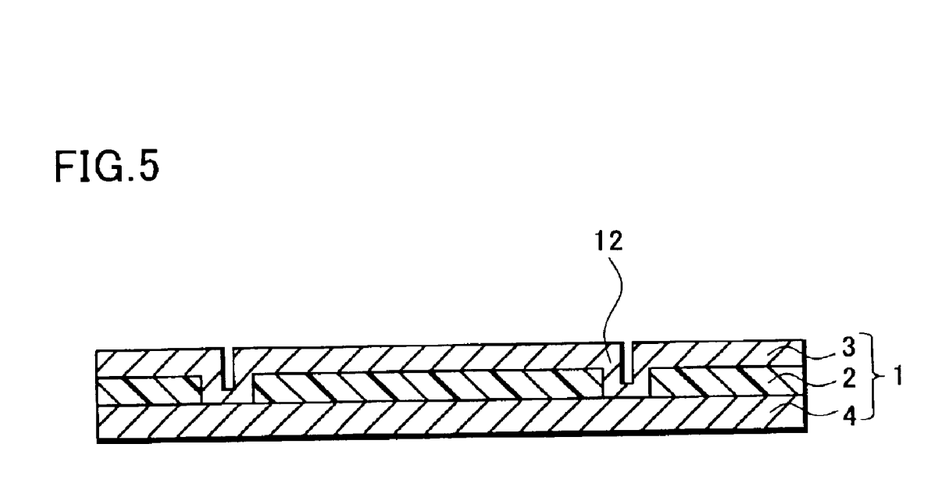
FIG. 5 is a sectional view describing a method for fabricating a circuit device according to the invention.

The third step according to the invention forms multi-layer connecting means 12 in the through holes 21 as shown in FIG. 5, and may electrically connect the first conductive layer 3 and the second conductive layer 4.

A plated layer, which is multi-layer connecting means 12 to permit electric connections between the second conductive layer 4 and the first conductive layer 3, is formed on the entire surface of the first conductive layer 3 including the through holes 21. The plated layer is formed by both non-electrolytic plating and electrolytic plating. Herein, Cu of approx. 2 μm is formed on the entire surface of the first conductive layer 3 including at least the through holes 21 by the non-electrolytic plating, whereby since the first conductive layer 3 and the second conductive layer 4 are electrically made conductive, the electrolytic plating is carried out again by using the first conductive layer 3 and the second conductive layer 4 as electrodes to plate Cu approx. 20 μm thick. Thus, the through holes 21 are filled with Cu, and multi-layer connecting means 12 is thus formed. Also, if EBARA-UDYLITE is employed which is the brand name of a plating solution, it is possible to selectively fill in only the through holes 21. Also, although Cu is employed as the plated layer, Au, Ag, Pd, etc., maybe used. Further, partial plating may be acceptable by using a mask.

Figure 6:
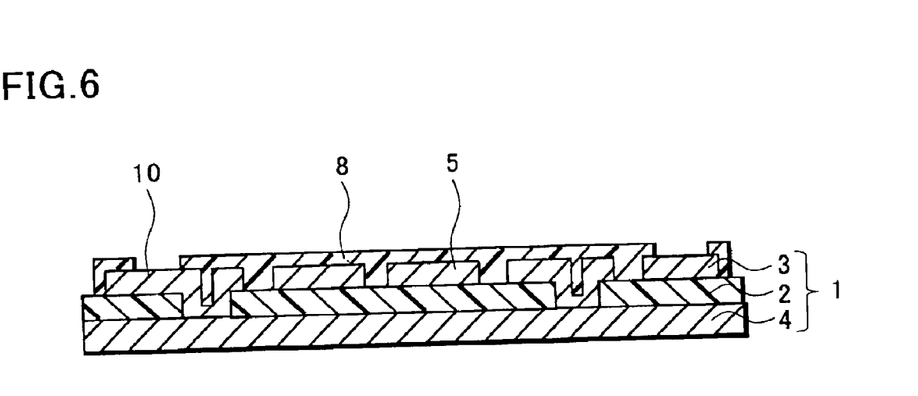
FIG. 6 is a sectional view describing a method for fabricating a circuit device according to the invention.
Figure 7:
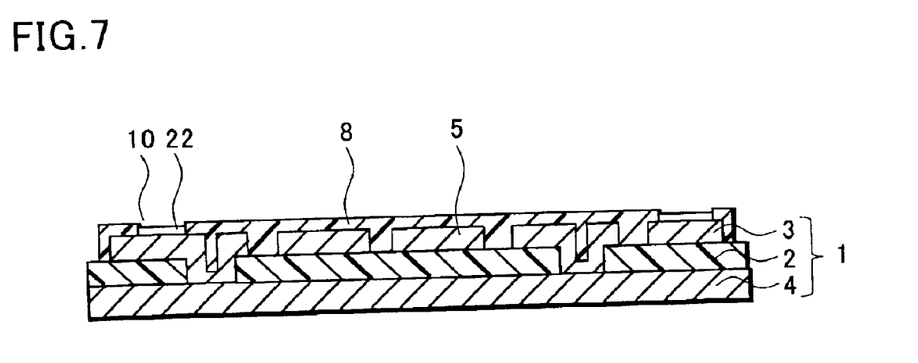
FIG. 7 is a sectional view describing a method for fabricating a circuit device according to the invention.

The fourth step according to the invention forms the first conductive path layer 5 by etching the first conductive layer 3 to an appointed pattern as shown in FIG. 6 and FIG. 7.

The first conductive layer 3 is overcoated with photo-resist of an appointed pattern, and the bonding pads 10 and the first conductive path layer 5 extending from these bonding pads 10 to the center of a substrate are formed by chemical etching. Since the first conductive layer 3 is mainly composed of Cu, the etching solution of ferric chloride or cupric chloride may be used for the chemical etching.

Since the first conductive layer 3 is formed to be 5 through 35 μm or so, the first conductive path layer 5 may be formed to be a fine pattern which is smaller than 50 μm.

Continuously, the bonding pads 10 of the first conductive path layer 5 are exposed, and other portions are overcoated with overcoating resin 8. The overcoating resin 8 is such that epoxy resin, etc., is dissolved with a solvent and is adhered by a screen printing method, and is thermally hardened.

Also, as shown in FIG. 7, a plating layer 22 of Au, Ag, etc., is formed on the bonding pads 10 in consideration of the bonding property. The plating layer 22 is selectively adhered, by a non-electrolytic plating method, to the bonding pads 10 using the overcoating resin 8 as a mask, or is adhered, by an electrolytic plating method, using the second conductive layer 4 as an electrode.

Figure 8:
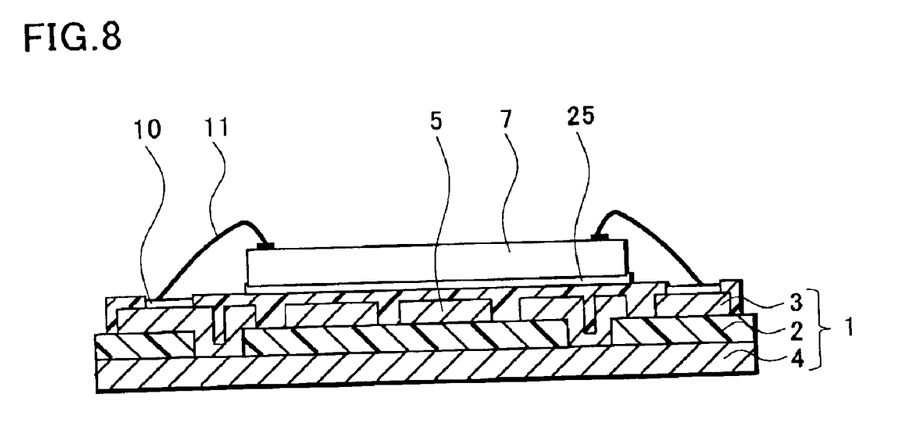
FIG. 8 is a sectional view describing a method for fabricating a circuit device according to the invention.

The fifth step according to the invention adheres and fixes a semiconductor element 7 on the first conductive path layer 5 after being electrically insulated therefrom as shown in FIG. 8.

The semiconductor element 7 is die-bonded on the overcoating resin 8 by insulation adhesion resin 25 as it is a bare chip. Since the semiconductor element 7 is electrically insulated from the first conductive path layer 5 immediately therebelow by the overcoating resin 8, the first conductive path layer 5 can be freely routed below the semiconductor element 7, thereby achieving a multi-layered path structure.

Also, respective electrode pads 9 of the semiconductor element 7 are connected to the bonding pads 10, which are parts of the first conductive path layer 5 secured at the periphery, by bonding wires 11. The semiconductor elements 7 may be assembled with the faces down. In this case, soldering balls and bumps are provided on the surface of the respective electrode pads 9 of the semiconductor elements 7, and electrodes similar to the bonding pads 10 are provided at portions corresponding to the positions of the soldering balls on the surface of the insulation resin sheet 1. (See FIG. 11).

A description is given of the advantages of using the insulation resin sheet 1 when bonding wires. Generally, when bonding Au wires, heating is carried out around 200 through 300° C. At this time, the insulation resin sheet 1 is warped if the second conductive layer 4 is thin. If the insulation resin sheet 1 is compressed via the bonding head in this state, there is a possibility for the insulation resin sheet 1 to be cracked. This remarkably occurs since, if a filler is blended in the insulation resin 2, the material itself becomes hard and flexibility is lost. Also, since resin is softer than metals, energy of compression and ultrasonic waves may be dispersed in the bonding of Au and Al. However, if the insulation resin 2 is made thin and the second conductive layer 4 is formed to be thick, these problems can be solved.

Figure 9:
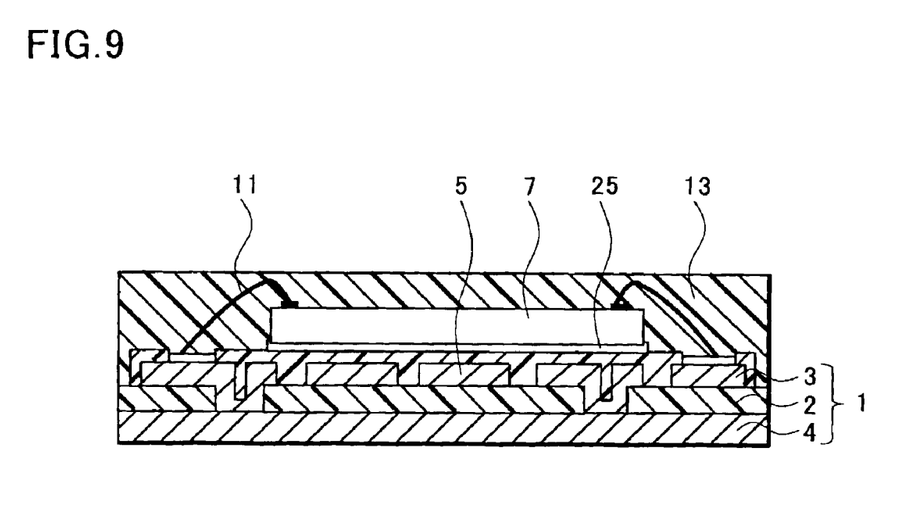
FIG. 9 is a sectional view describing a method for fabricating a circuit device according to the invention.

The sixth step according to the invention overcoats the first conductive path layer 5 and the semiconductor element 7 with a sealing resin layer 13 as shown in FIG. 9.

The insulation resin sheet 1 is set in a molding apparatus and is used for resin molding. Transfer molding, injection molding, coating, dipping, etc., maybe possible as the molding method. However, in consideration of mass production, the transfer molding and injection molding are favorable.

Although, in this step, it is necessary that the insulation resin sheet 1 is flatly brought into contact with the lower metal die of a mold cavity, the second conductive layer 4, which is thick, functions like this. In addition, until contraction of the sealing resin layer 13 is completely finished after the insulation resin sheet 1 is taken out from the mold cavity, the flatness of a package can be maintained by the second conductive layer 4.

That is, the role of the mechanical support of the insulation resin sheet 1 is retained by the second conductive layer 4.

Figure 10:
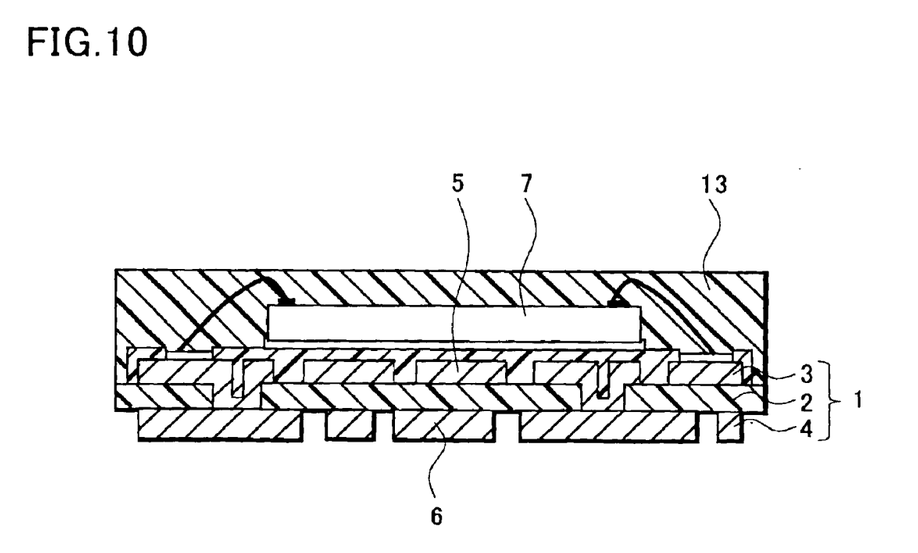
FIG. 10 is a sectional view describing a method for fabricating a circuit device according to the invention.

As shown in FIG. 10, the seventh step according to the invention etches the second conductive layer 4 to an appointed pattern and forms the second conductive path layer 6.

The second conductive layer 4 is overcoated with photoresist of an appointed pattern, and the second conductive path layer 6 is formed by chemical etching. Since the second conductive layer 4 is thick, it not suitable for fine patterning. However, since the second conductive layer 4 mainly aims at forming an external electrode 14, there is no problem. The second conductive path layers 6 are arrayed at fixed intervals as shown in FIG. 2, and the second conductive path layers 6 are electrically connected to each other via the first conductive path layers 5 and multi-layer connecting means 12, thereby achieving a multi-layered connection structure. Also, if necessary, the second conductive path layer 6 to cross the first conductive path layers 5 at blank portions may be formed.

The eighth step according to the invention forms, as shown in FIG. 1, external electrodes 14 at appointed points of the second conductive path layer 6.

The second conductive path layer 6 has portions, at which the external electrodes 14 are formed, exposed, and almost all the portions of the second conductive path layer 6 are overcoated with an overcoating resin layer 15 by screen-printing of epoxy resin, etc., which is dissolved by a solvent. Next, external electrodes 14 are simultaneously formed at the exposed portions by reflow of solder.

Finally, since a number of circuit devices are formed on the insulation resin sheet 1 in the form of matrices, the sealing resin layer 13 and insulation resin sheet 1 are diced and are separated for individual circuit devices.

Figure 11:
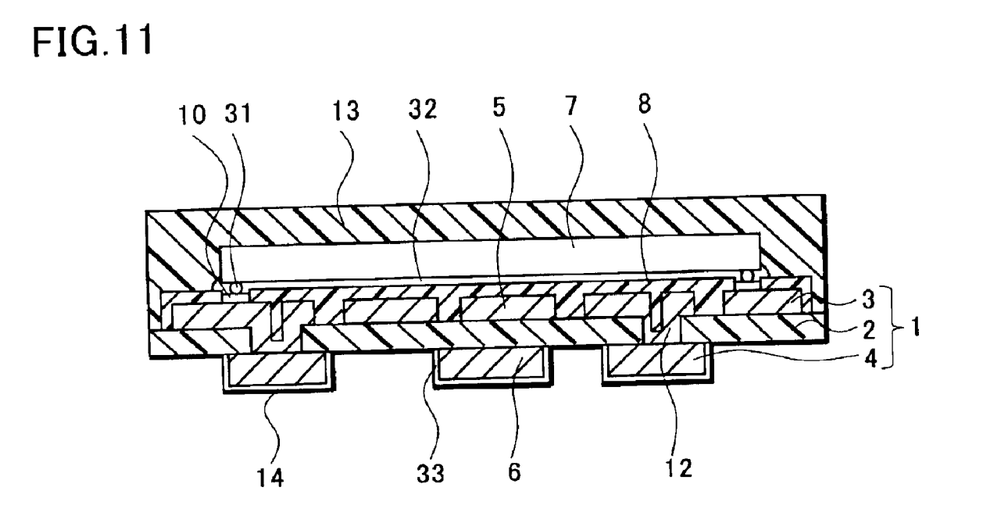
FIG. 11 is a sectional view describing another circuit device according to the invention.

FIG. 11 shows a structure in which a semiconductor element 7 is assembled with its face down. Parts which are similar to those in FIG. 1 are given the same reference numbers. A bump electrode 31 is provided at the semiconductor element 7, and the bump electrode 31 is connected to a bonding pad 10. Under-filling resin 32 is filled in the gap between the overcoat resin 8 and the semiconductor element 7. Bonding wires can be removed in this structure, and the thickness of the sealing resin layer 13 can be made thinner. Also, the external electrodes 14 can be achieved by a bump electrode in which the second conductive layer 4 is etched, and the surface thereof is overcoated with a gold- or palladium-plated layer 33.

What is claimed is:

1. A circuit device comprising:

a first conductive layer;

a second conductive layer;

insulation resin by which said first conductive layer and said second conductive layer are adhered to each other in the form of a sheet;

a first conductive path layer that is formed by etching said first conductive layer;

a second conductive path layer that is formed by etching said second conductive layer;

a semiconductor element electrically insulated and fixed on said first conductive path layer;

multi-layer connecting means for connecting said first conductive path layer and said second conductive path layer to each other at appointed points, passing through said insulation resin;

a sealing resin layer for overcoating said first conductive path layer and said semiconductor element; and an external electrode secured at an appointed point of said second conductive path layer, wherein the first conductive path layer and the semiconductor element are supported from above by the sealing resin layer, wherein said second conductive layer is formed to become thicker than the first conductive layer in order to retain supporting strength.

2. The circuit device according to claim 1, wherein said insulation resin is mainly formed of polyimide resin or epoxy resin.

3. The circuit device according to claim 1, wherein said insulation resin is thinner than said second conductive layer.

4. The circuit device according to claim 1, wherein said semiconductor element is adhered to and fixed at an overcoat resin that overcoats said first conductive path layer.

5. The circuit device according to claim 1, wherein said multi-layer connecting means is a conductive metal-plated layer.

6. The circuit device according to claim 1, wherein almost the entire second conductive path layer is overcoated with overcoat resin, and an external electrode formed of solder is provided at an appointed point exposed from said overcoat resin.

7. circuit device comprising:

a first conductive layer;

a second conductive layer;

insulation resin by which said first conductive layer and said second conductive layer are adhered to each other in the form of a sheet;

a first conductive path layer that is formed by etching said first conductive layer;

a second conductive path layer that is formed by etching said second conductive layer;

a semiconductor element electrically insulated and fixed on said first conductive path layer;

multi-layer connecting means for connecting said first conductive path layer and said second conductive path layer to each other at appointed points, passing through said insulation resin;

a sealing resin layer for overcoating said first conductive path layer and said semiconductor element; and an external electrode secured at an appointed point of said second conductive path layer, wherein the second conductive layer is thicker than the first conductive layer.

8. A circuit device comprising:

a first conductive layer;

a second conductive layer;

insulation resin by which said first conductive layer and said second conductive layer are adhered to each other in the form of a sheet;

a first conductive path layer that is formed by etching said first conductive layer;

a second conductive path layer that is formed by etching said second conductive layer;

a semiconductor element electrically insulated and fixed on said first conductive path layer;

multi-layer connecting means for connecting said first conductive path layer and said second conductive path layer to each other at appointed points, passing through said insulation resin;

a sealing resin layer for overcoating said first conductive path layer and said semiconductor element; and an external electrode secured at an appointed point of said second conductive path layer, wherein the insulation resin is thinner than the second conductive layer.

* * * * *